(12) United States Patent
Wang et al.

(10) Patent No.: US 8,897,012 B2
(45) Date of Patent: Nov. 25, 2014

(54) ELECTRONIC DEVICE AND HEAT DISSIPATION MODULE THEREOF

(71) Applicants: Inventec (Pudong) Technology Corporation, Shanghai (CN); Inventec Corporation, Taipei (TW)

(72) Inventors: Feng-Ku Wang, Taipei (TW); Yi-Lun Cheng, Taipei (TW); Chih-Kai Yang, Taipei (TW); Wei-Hsin Wu, Taipei (TW); Hua-Feng Chen, Taipei (TW); Ming-Hung Lin, Taipei (TW)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 215 days.

(21) Appl. No.: 13/714,668

(22) Filed: Dec. 14, 2012

(65) Prior Publication Data

US 2013/0294030 A1    Nov. 7, 2013

(30) Foreign Application Priority Data

May 4, 2012    (TW) .............................. 101116032 A (51) Int. Cl.
*H05K 7/20* (2006.01)
*F28D 15/02* (2006.01)
*G06F 1/20* (2006.01)

(52) U.S. Cl.
CPC ............ *H05K 7/20336* (2013.01); *F28D 15/02* (2013.01); *H05K 7/20445* (2013.01); *G06F 1/203* (2013.01); *F28D 15/0275* (2013.01)
USPC .................. 361/700; 361/679.52; 361/679.54; 361/702; 361/703; 361/715; 361/719; 165/80.2; 165/80.3; 165/104.21; 165/104.26; 165/104.33

(58) Field of Classification Search
USPC ....................... 361/679.46–679.54, 690–697, 361/698–715, 719, 717, 720–724; 165/80.2, 80.3, 80.4, 80.5, 104.14, 165/104.21, 104.26, 104.33, 104.34, 165/121–126, 185; 174/15.1, 15.2, 16.1, 174/16.3, 252; 257/706–727; 29/890.035, 29/890.04, 890.032
See application file for complete search history.

(56) References Cited

U.S. PATENT DOCUMENTS

| | | | | |
|---|---|---|---|---|
| 6,122,169 A * | 9/2000 | Liu et al. | ........................ | 361/700 |
| 6,373,700 B1 * | 4/2002 | Wang | ............................ | 361/698 |
| 6,397,941 B1 * | 6/2002 | McCullough | ................. | 165/185 |
| 6,538,884 B1 * | 3/2003 | Wong et al. | ................... | 361/688 |
| 6,717,811 B2 * | 4/2004 | Lo et al. | ........................ | 361/698 |
| 7,369,412 B2 * | 5/2008 | Peng et al. | .................... | 361/715 |
| 7,385,820 B1 * | 6/2008 | Chen | ............................. | 361/704 |

(Continued)

*Primary Examiner* — Michail V Datskovskiy
(74) *Attorney, Agent, or Firm* — Tim Tingkang Xia, Esq.; Morris, Manning & Martin, LLP (57) ABSTRACT

The disclosure provides an electronic device and a heat dissipation module having an imaginary structural plane. The heat dissipation module includes a fin assembly, a connecting part and a heat pipe. The fin assembly is disposed on the structural plane and includes a plurality of fin elements extending along a first direction. The connecting part is connected to the fin elements. The fin elements are connected to each other via the connecting part. At least one portion of the connecting part is connected to at least one portion of the heat pipe, and the connecting part and the heat pipe both extend along a second direction. The fin assembly and the connecting part are integrated and formed into one piece by die casting. The first direction and the second direction form a first included angle greater than 0 degree.

20 Claims, 12 Drawing Sheets

(56) References Cited

U.S. PATENT DOCUMENTS

| | | | |
|---|---|---|---|
| 7,573,714 B2 * | 8/2009 | Ali | 361/700 |
| 7,881,060 B2 * | 2/2011 | Chung et al. | 361/700 |
| 2009/0294114 A1 * | 12/2009 | Yang et al. | 165/185 |
| 2010/0238630 A1 * | 9/2010 | Xu et al. | 361/700 |

* cited by examiner

ELECTRONIC DEVICE AND HEAT DISSIPATION MODULE THEREOF

CROSS-REFERENCE TO RELATED APPLICATIONS

This non-provisional application claims priority under 35 U.S.C. §119(a) on Patent Application No(s). 101116032 filed in Taiwan, R.O.C. on May 4, 2012, the entire contents of which are hereby incorporated by reference.

BACKGROUND

1. Technical Field

The present disclosure relates to an electronic device and a heat dissipation module thereof, and more particularly, to an electronic device and a heat dissipation module thereof having multiple fin elements.

2. Related Art

Compared to a general computer, a thin client is a low-level computing apparatus without built-in compact disc driver, hardware device, soft disc driver and other unnecessary soft/hardware device or function. The thin client is connected to a server which stores application programs and information data of the thin client. When the thin client is operated by a user, the thin client transmits a command of the user to the server to execute operation of the command or save data needed by the user. After that, the server transmits an operating result back to the thin client and the result is displayed to the user by a display device. In other words, the thin clients only are terminal devices which provide inputting and basic functions, and other operating and saving functions of the thin client, and the thin clients are gathered and managed by the server.

Generally speaking, such thin client only includes multiple basic elements, such as a computing processing unit (CPU), a motherboard, a memory, a power supply and basic input/output ports. Therefore, the user may not install programs or save data in the thin client, otherwise, the data are saved in the server. That is, the thin client without saving function is uneasily affected by virus. As for the whole system, the arrangement of the thin client and the server may improve the protection of the data to make sure the safety of the data and keep the service uninterruptedly. Thus, in order to improve the network safety and equipment cost of an organization, the thin client becomes the basic computing device adopted by large organizations and enterprises.

The thin client is composed of the low-level electronic elements, so the operating frequency of the thin client is much slower than that of the general computer, thereby generating less heat. So, the general thin client does not include any active heat dissipation module, such as a fan module, for performing heat dissipation on the electronic elements of the thin client. In detail, the heat dissipation module consists of a heat dissipation plate and a heat pipe which is located on the heat dissipation plate. The heat dissipation plate is directly connected to the electronic element to perform heat dissipation on it. However, when the operating frequency of the electronic element is increased, the heat generated by the electronic element is increased, too. But the thin client without the active heat dissipation module may not bring the heat out immediately due to the increasing operating frequency of the electronic element. When the heat which is generated by the electronic element may not be removed by the heat dissipation plate, the excess heat will affect the stability of the operated thin client. Therefore, there is an emergent need of a heat dissipation module of a thin client to solve the problem of poor heat dissipating efficiency of the thin client which affects the stability of operation of the thin client.

SUMMARY

An embodiment discloses a heat dissipation module having an imaginary structural plane. The heat dissipation module comprises a fin assembly, a connecting part and a heat pipe. The fin assembly is disposed on the structural plane and includes a plurality of fin elements extending along a first direction. The connecting part is connected to the fin elements. The fin elements are connected to each other via the connecting part. At least one portion of the connecting part is connected to at least one portion of the heat pipe, and the connecting part and the heat pipe both extend along a second direction. The fin assembly and the connecting part are integrated and formed into one piece by die casting. The first direction and the second direction form a first included angle greater than 0 degree.

Another embodiment discloses an electronic device comprising a circuit board, a casing, a mainframe and a heat dissipation module. The circuit board comprises an electronic element. The circuit board is disposed in the casing and comprises a mainframe and a heat dissipation module. The heat dissipation module is disposed on a side of the mainframe and in thermal contact with the electronic element. The heat dissipation module has an imaginary structural plane and comprises a fin assembly, a connecting part and a heat pipe. The fin assembly is disposed on the structural plane and comprises a plurality of fin elements extending along a first direction. The connecting part is connected to the fin elements. The fin elements are connected to each other via the connecting part. At least one portion of the connecting part is connected to at least one portion of the heat pipe, and the connecting part and the heat pipe both extend along a second direction. The fin assembly and the connecting part are integrated and formed into one piece by die casting, and the first direction and the second direction form a first included angle greater than 0 degree together.

Yet another embodiment discloses a heat dissipation module for being in thermal contact with an electronic element and having an imaginary structural plane. The heat dissipation module comprises a connecting part, a plurality of fin elements, a heat-absorbing plate and a heat pipe. The connecting part includes a container. The fin elements extend outwardly from the structural plane. Each of the fin elements has an outer surface away from the structural plane, respectively. The heat-absorbing plate is connected to at least one of the fin elements and includes a contact surface which is coplanar with the structural plane. The heat-absorbing plate is used for being in thermal contact with the electronic element at the contact surface. The heat pipe is disposed in the container and is in thermal contact with the heat-absorbing plate and the connecting part.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

The detailed features and advantages of the disclosure are described below in great detail through the following embodiments, the content of the detailed description is sufficient for those skilled in the art to understand the technical content of the present disclosure and to implement the disclosure there accordingly. Based upon the content of the specification, the claims, and the drawings, those skilled in the art can easily understand the relevant objectives and advantages of the disclosure.

It will be understood that, relative terms, such as "lower" or "bottom", "on" or "top", "left" or "right" may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

An embodiment discloses a heat dissipation module for being in thermal contact with and performing heat dissipation on an electronic element such that the electronic element may be kept in normal operation condition.

Figure 1A:
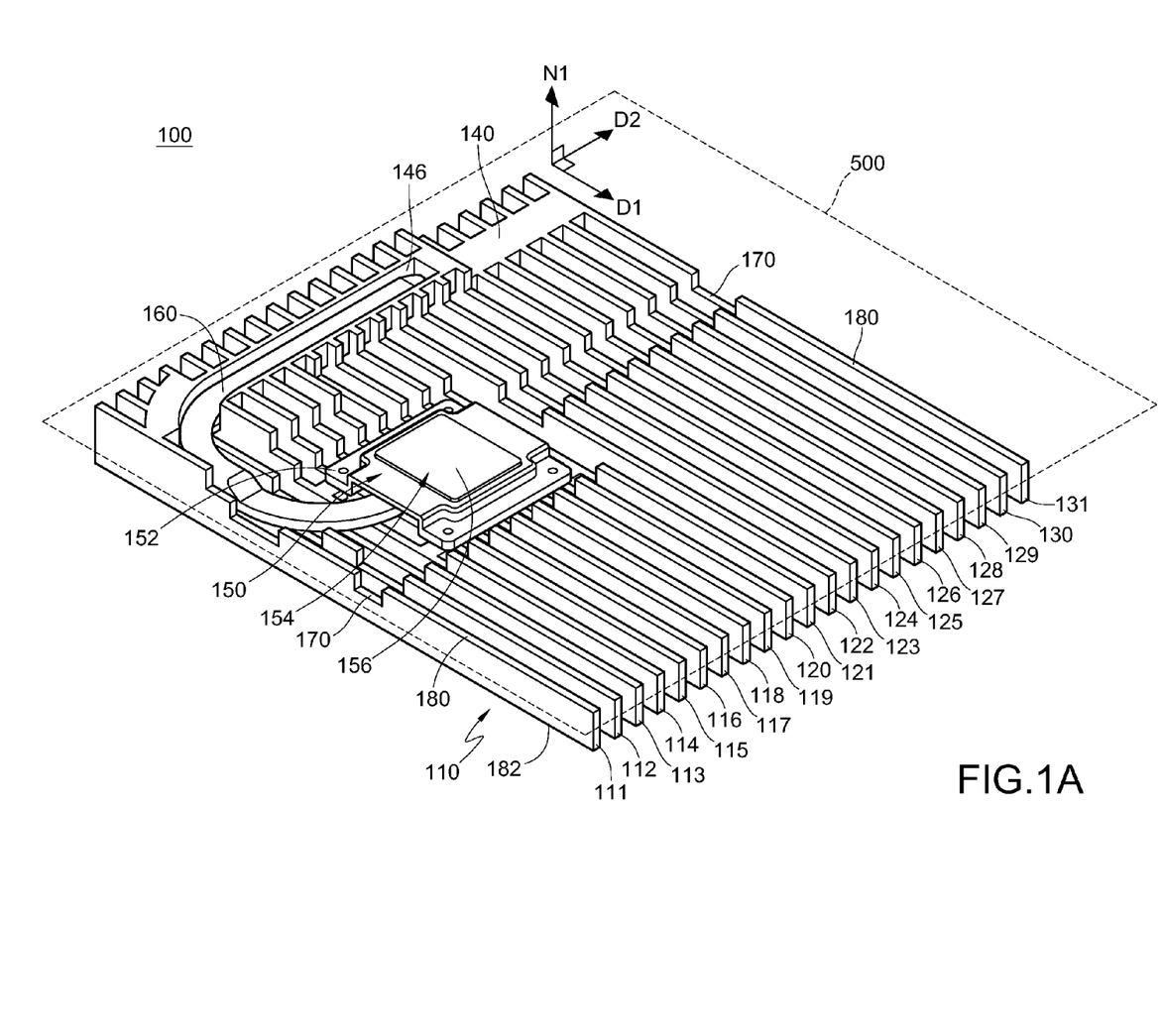
FIG. 1A is a schematic perspective view of a heat dissipation module according to an embodiment.
Figure 1B:
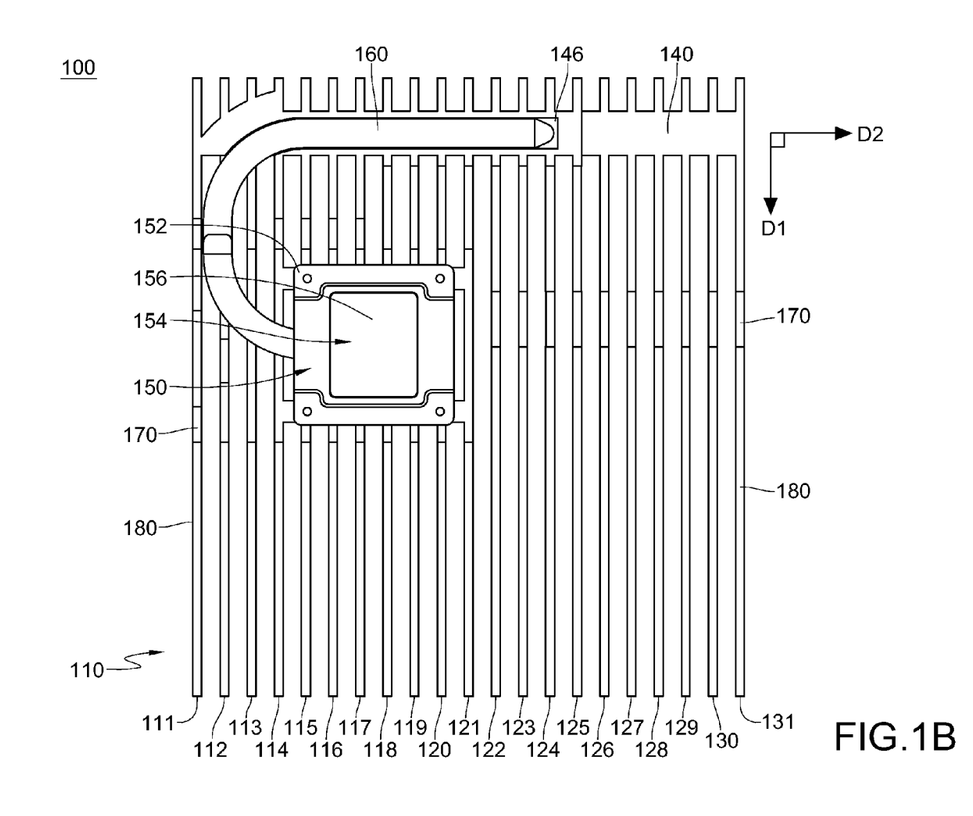
FIG. 1B is a top view of a heat dissipation module according to an embodiment.

Please refer to FIGS. 1A and 1B. FIG. 1A is a schematic perspective view of a heat dissipation module according to an embodiment. FIG. 1B is a top view of a heat dissipation module according to an embodiment. In this embodiment, a heat dissipation module 100 which has an imaginary structural plane 500 comprises a fin assembly 110, a connecting part 140 and a heat pipe 160. The fin assembly 110, disposed on the structural plane 500, comprises a plurality of fin elements 111-131 which extend along a first direction D1. The fin elements 111-131 are connected to each other via the connecting part 140. A hollow shape is formed between each pair of the adjacent fin elements 111-131 such that the hollow-shape area of the fin elements 111-131 which are in directly contact with outside air is increased.

At least one portion of the connecting part 140 is connected to at least one portion of the heat pipe 160. In some embodiments, the connecting part 140 includes a container 146 in which the heat pipe 160 is disposed. That is, a portion of the connecting part 140 is connected to a portion of the heat pipe 160. A portion of the heat pipe 160 and the connecting part 140 both extend outwardly along a second direction D2. Furthermore, the fin assembly 110 and the connecting part 140 are integrated and formed into one piece by die casting such that the structural strength of the heat dissipation module 100 is enhanced to prevent from structural failure by an external force.

A first included angle, formed between the first direction D1 and the second direction D2, is greater than 0 degree. In this embodiment, the first direction D1 is perpendicular to the second direction D2. Moreover, in some embodiments, the first direction D1 is perpendicular to the normal line N1 of the structural plane 500.

In some embodiments, the heat dissipation module 100 further comprises a heat-absorbing plate 150. The heat-absorbing plate 150 is disposed on and connected to the fin elements 115-120. The heat-absorbing plate 150 includes a contact surface 156 which is coplanar with the structural plane 500. The contact surface 156 is used for being in thermal contact with an electronic element (not shown). An end of the heat pipe 160 is connected to the heat-absorbing plate 150, and another end of the heat pipe 160 is in thermal contact with the fin elements 111-120 of the fin assembly 110 via the container 146. Also, a portion of the heat pipe 160 extends from the connecting part 140 to the heat-absorbing plate 150. In other words, the heat pipe 160 bridges and crosses through the fin elements 111-124 (the heat pipe 160 is suspended in the air) such that the heat pipe 160 becomes a flex arm to enhance the flexibility of the whole heat dissipation module 100.

In some embodiments, the heat pipe 160 is connected to the container 146 by welding, but not limited to the disclosure. In other embodiment, the heat pipe 160 is disposed in the container 146 by buckling, locking or adhering and is in thermal contact with the fin assembly 110.

In some embodiments, the heat-absorbing plate 150 comprises a main body 152 and a heat-conducting element 154. The main body 152 is connected to the fin elements 115-120. The heat-conducting element 154 is disposed on the main body 152. In this embodiment, the material of the main body 152 is aluminum, that of the heat-conducting element 154 is copper, and the main body 152 and the heat-conducting element 154 are combined by welding, but not limited to the disclosure. The contact surface 156 is on the heat-conducting element 154 and used for being thermal contact with the electronic element (not shown). The main body 152 further comprises four spring screws (not shown) for being connected to a circuit board of the electronic element. Furthermore, the end of the heat pipe 160 is connected to the heat-conducting element 154 of the heat-absorbing plate 150. In some embodiments, each of the fin elements 111-131 includes a recess 170, an inner surface 180 and an outer surface 182 (the fin element 111 is shown for an example in the figure). The inner surface 180 represents a surface of each of the fin elements 111-131 which faces the structural plane 500. The outer surface 182 represents another surface of each of the fin elements 111-131 away from the structural plane 500. The recess 170 is formed inwardly towards the fin elements 111-131.

Figure 2A:
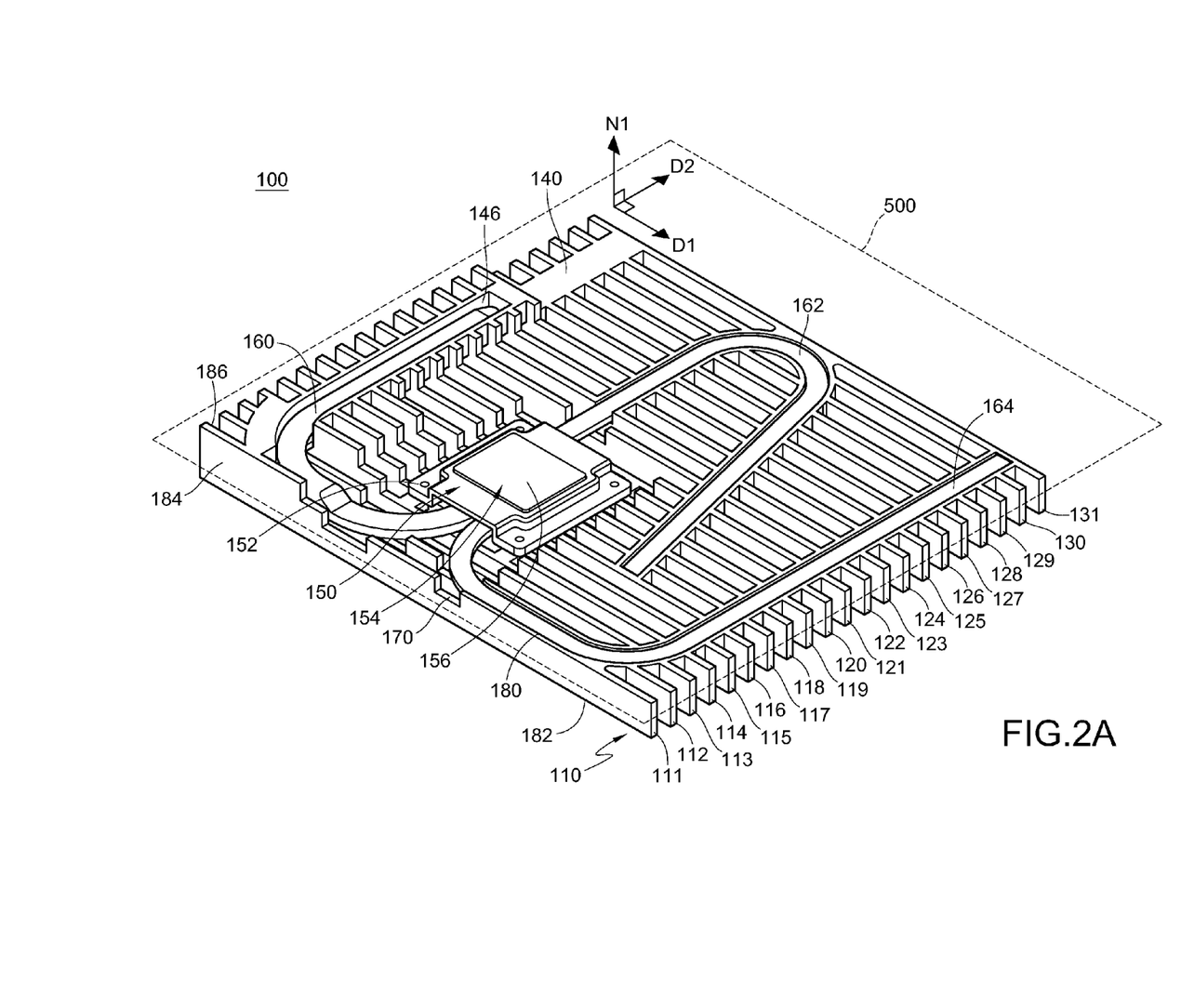
FIG. 2A is a schematic perspective view of a heat dissipation module according to another embodiment.
Figure 2B:
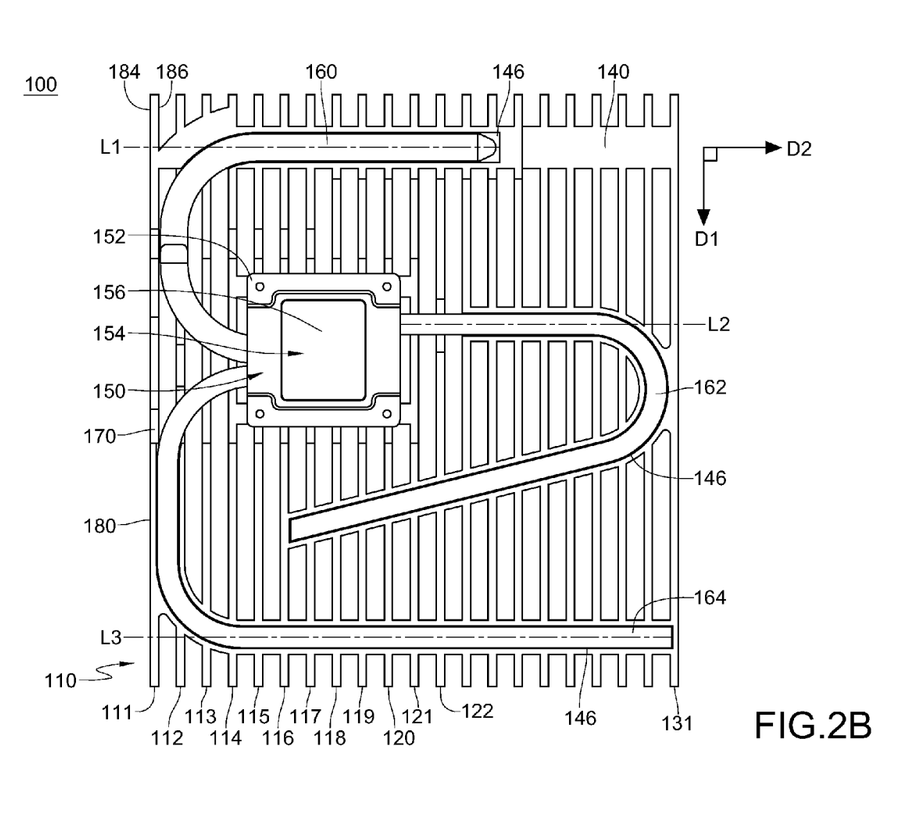
FIG. 2B is a top view of a heat dissipation module according to another embodiment.
Figure 2C:
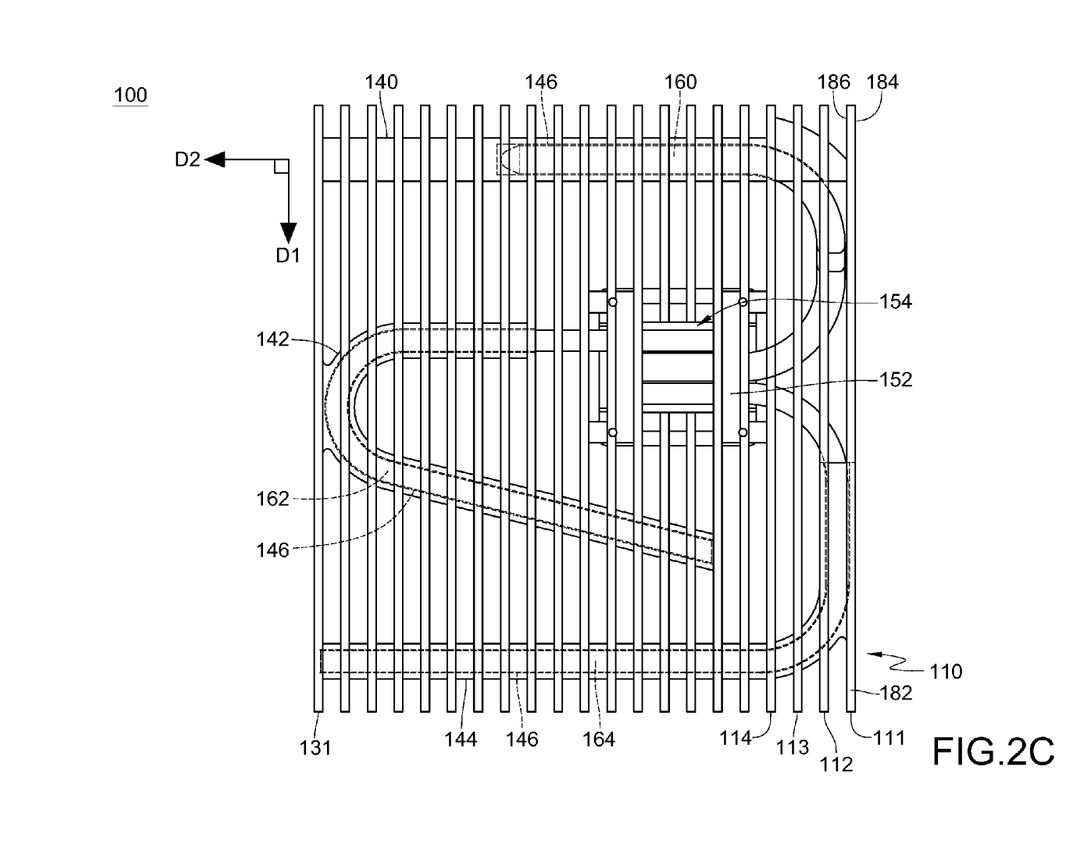
FIG. 2C is a bottom view of a heat dissipation module according to another embodiment.

The following describes another heat dissipation module according to another embodiment. Please refer to FIGS. 2A, 2B and 2C. FIG. 2A is a schematic perspective view of a heat dissipation module according to another embodiment. FIG. 2B is a top view of a heat dissipation module according to another embodiment. FIG. 2C is a bottom view of a heat dissipation module according to another embodiment. In an embodiment, a heat dissipation module 100 which is coplanar with an imaginary structural plane 500 is in thermal contact with an electronic element (not shown). The heat dissipation module 100 comprises three connecting parts 140, 142, 144, a plurality of fin elements 111-131, a heat-absorbing plate 150 and three heat pipes 160, 162, 164. Each of the connecting part 140, 142, 144 includes a container 146. Each of the fin elements 111-131, which extend outwardly from the connecting parts 140, 142, 144, includes an inner surface 180, an outer surface 184 (as shown in FIG. 2C), a first heat dissipation surface 184 and a second heat dissipation surface 186. Take the fin element 111 as an example. The first heat dissipation surface 184 and the second heat dissipation surface 186 are opposite to each other (two opposite side) between the inner surface 180 and the outer surface 184. The heat-absorbing plate 150, disposed on and connected to the fin elements 115-120, includes a contact surface 156 which is in thermal contact with the electronic element. Furthermore, the contact surface 156 is coplanar with the structural plane 500. A portion of each of the heat pipes 160, 162, 164 is disposed on the container 146 of the connecting parts 140, 142, 144. The heat-absorbing plate 150 comprises a main body 152 and a heat-conducting element 154.

Compared to the above-mentioned first embodiment, the main difference between the first embodiment and this (second) embodiment is that the number of the connecting part and the heat pipe. That is, the heat dissipation module 100 in this embodiment comprises the three connecting parts 140, 142, 144 and the three heat pipes 160, 162, 164. The heat pipe 162 is disposed on the connecting part 142, and the heat pipe 164 is disposed on the connecting part 144. Moreover, the heat pipe 162 is further connected to the main body 152 of the heat-absorbing plate 150 and to the fin elements 116-131 through the container 146. The heat pipe 164 is also connected to the main body 152 of the heat-absorbing plate 150 and to the fin elements 116-131 through the container 146. By disposing the three heat pipes 160, 162, 164 on different positions of the fin elements 111-131, heat, absorbed by the heat-absorbing plate 150, is quickly transferred to the fin elements 111-131. At the same time, the heat may spread to the fin elements 111-131 evenly such that the whole heat dissipation module 100 is in a uniform temperature, thereby improving the heat dissipation efficiency of the heat dissipation module 100.

In some embodiments, a portion of the heat pipe 160 extends from and bridges the connecting part 140 to the heat-absorbing plate 150, a portion of the heat pipe 162 extends from and bridges the connecting part 142 to the heat-absorbing plate 150, and a portion of the heat pipe 164 extends from and bridges the connecting part 144 to the heat-absorbing plate 150 (as shown in FIG. 2C, the solid lines of the heat pipes 160, 162, 164 indicate that the heat pipes 160, 162, 164 are suspended in the air). In other words, the heat pipes 160, 162, 164 become flex arms to enhance the flexibility of the whole heat dissipation module 100.

In some embodiments, the fin elements 111-131 extend outwardly from the connecting parts 140, 142, 144 along a first direction D1. In other words, the fin elements 111-131 are parallel to each other.

In some embodiments, a portion of the connecting part 140 has a long axis L1, a portion of the connecting part 142 has a long axis L2, and a portion of the connecting part 144 has a long axis L3 (as shown in FIG. 2B). The long axes L1, L2, L3 are parallel to a second direction D2, respectively, and the first direction D1 is perpendicular to the second direction D2.

Therefore, the first direction D1 is perpendicular to the long axes L1, L2, L3 at the same time.

In some embodiments, each of the fin elements 111-122 includes a recess 170 (The figures are taken the fin element 111 as an example). The recesses 170 are formed inwardly from an outer surface 180 towards the fin elements 111-122.

Figure 3:
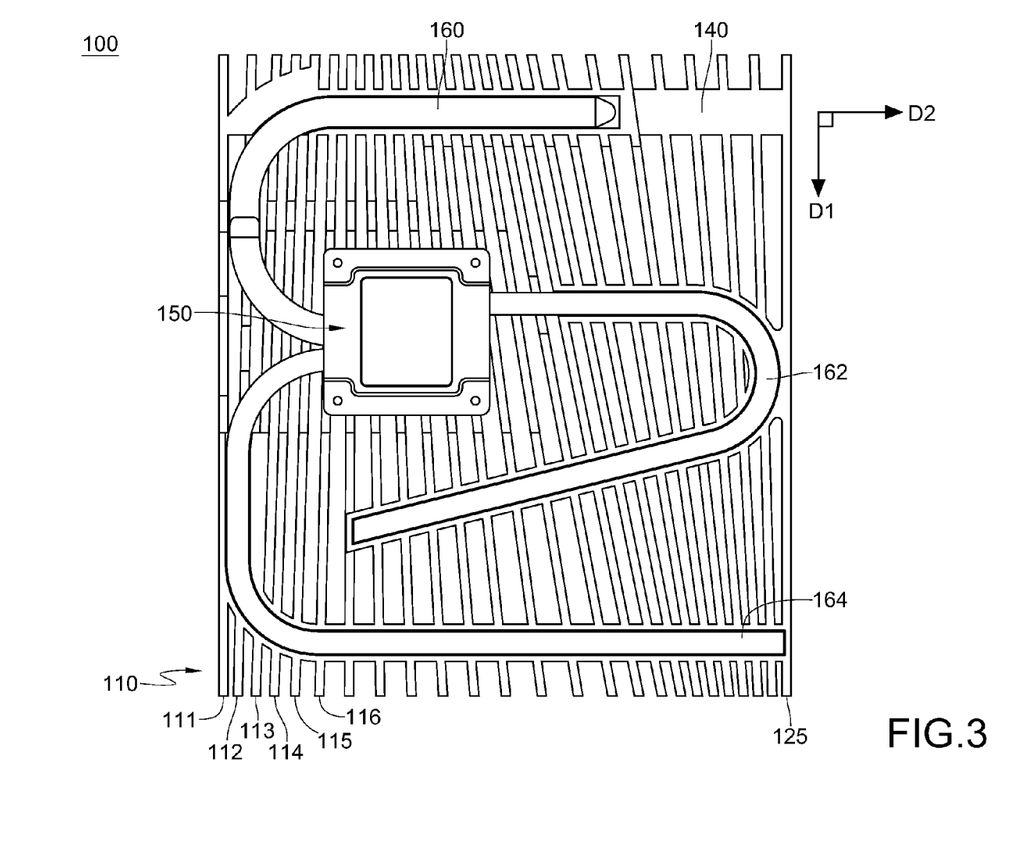
FIG. 3 is a top view of a heat dissipation module according to yet another embodiment.

The heat dissipation modules 100 having the fin elements 111-122 parallel to each other according to the above-mentioned embodiments are not limited to the disclosure. Please refer to FIG. 3, which is a top view of a heat dissipation module according to yet another embodiment. In this embodiment, a fin assembly of a heat dissipation module 100 comprises a plurality of fin elements 111-125 extending towards different directions. Therefore, by adjusting the arrangement of directions and positions of the fin elements 111-125, the heat dissipation efficiency of the heat dissipation modules 100 is enhanced.

Figure 4A:
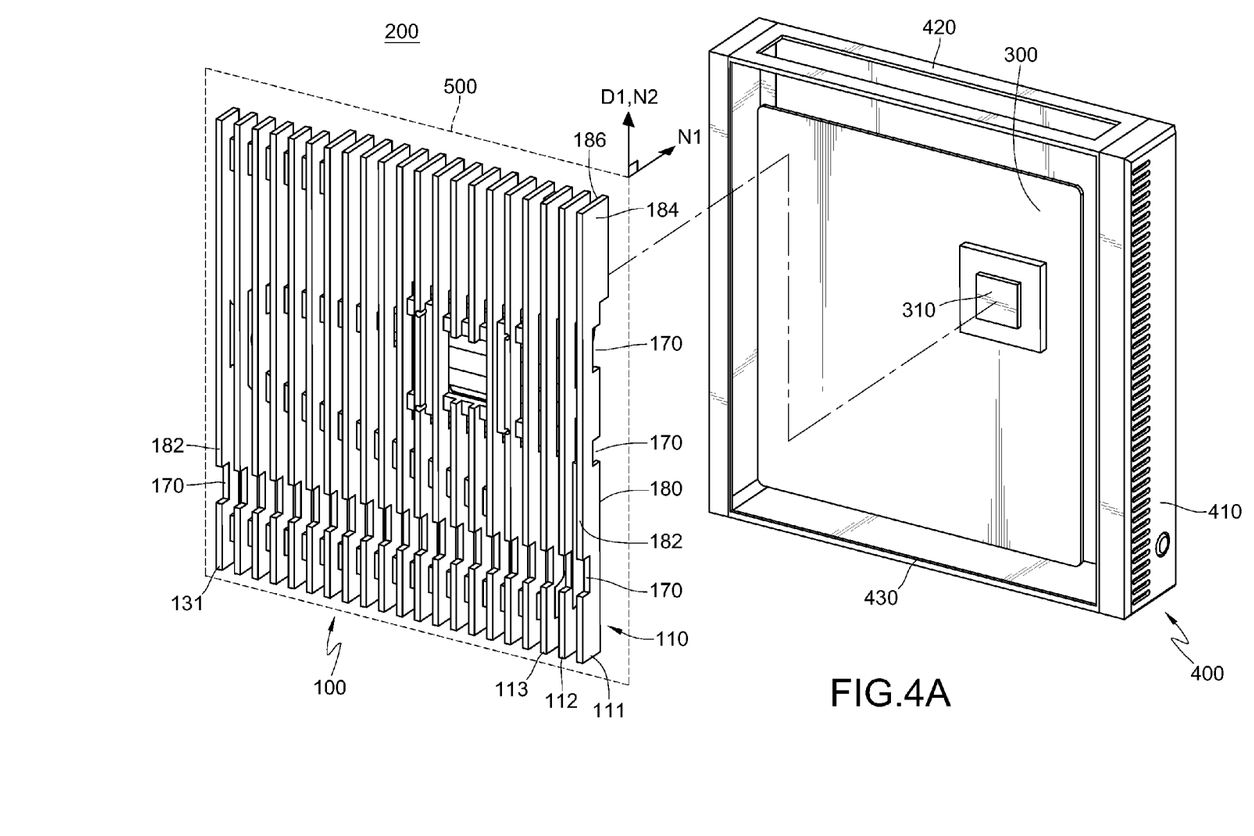
FIG. 4A is an exploded view of an electronic device according to an embodiment.
Figure 4B:
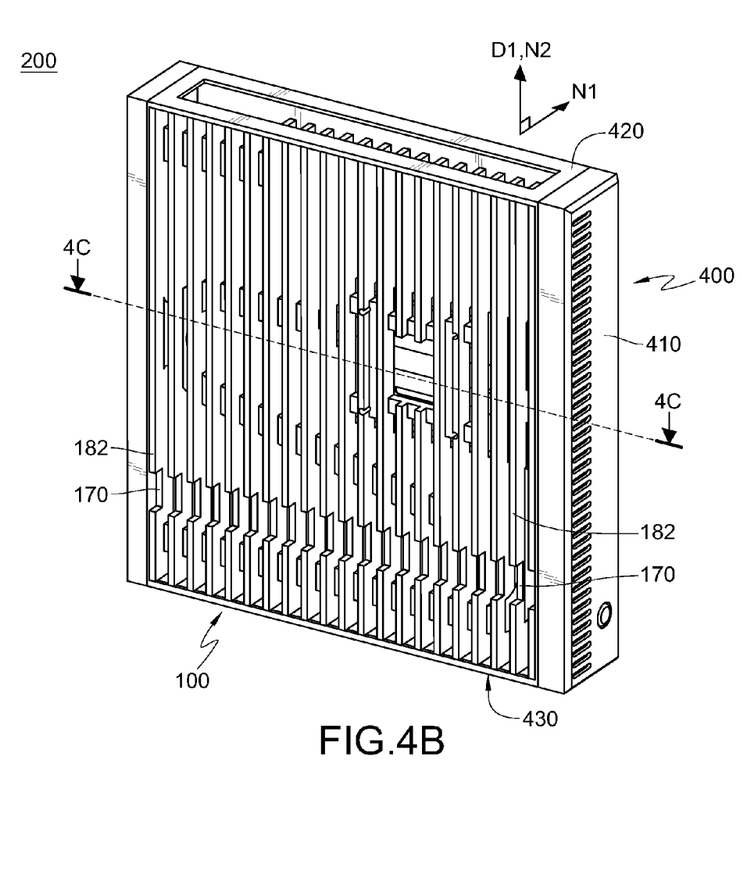
FIG. 4B is a perspective view of an electronic device according to an embodiment.
Figure 4C:
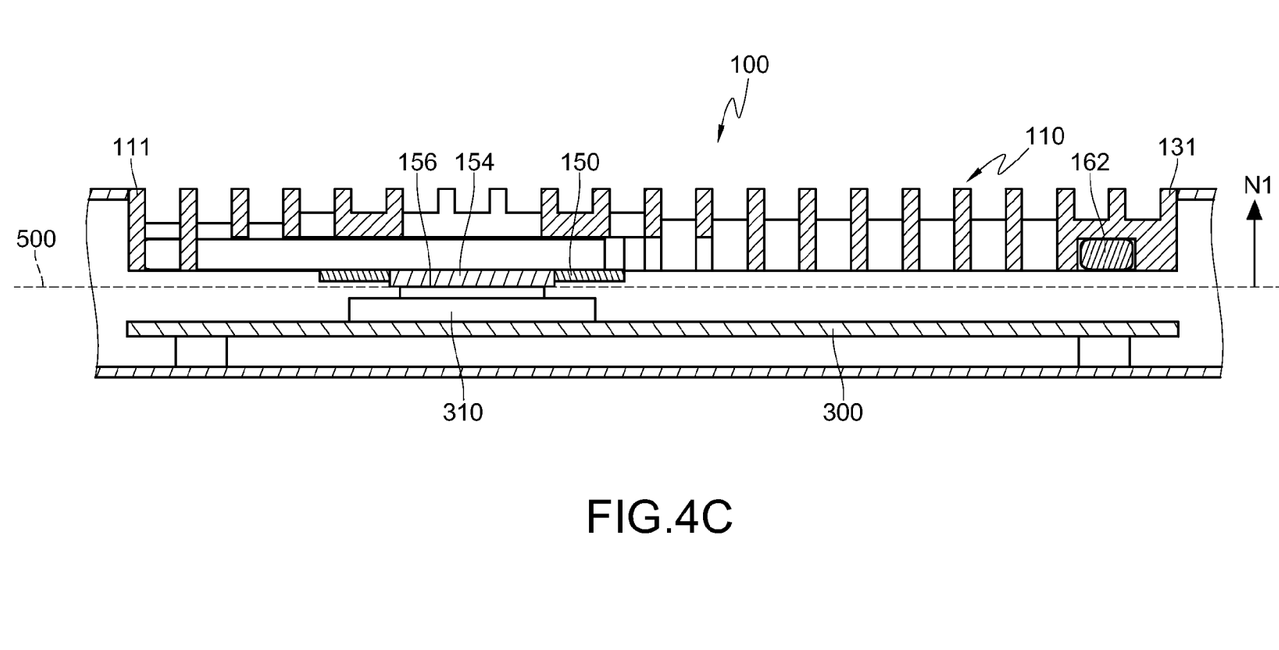
FIG. 4C is a cross-sectional profile of an electronic device along line 4C-4C according to an embodiment.

The above-mentioned heat dissipation module may be assembled in an electronic device which is a thin client computer. Please refer to FIGS. 4A, 4B and 4C. FIG. 4A is an exploded view of an electronic device according to an embodiment. FIG. 4B is a perspective view of an electronic device according to an embodiment. FIG. 4C is a cross-sectional profile of an electronic device along line 4C-4C according to an embodiment. A heat dissipation module 100 in this embodiment is similar to that of the second embodiment (as shown in FIGS. 2A to 2D), and the same numerals represent the similar elements, so the similar descriptions are not repeated herein. An electronic device 200 comprises a circuit board 300 and a casing 400. The circuit board 300 comprises an electronic element 310, such as a CPU. The circuit board 300 is disposed in the casing 400 for preventing the circuit board 300 from exposure. The casing 400 comprises a mainframe 410 and the heat dissipation module 100 which is disposed on a side of the mainframe 410. The heat dissipation module 100 is in thermal contact with the electronic element 310. In this embodiment, the heat dissipation module 100 is directly exposed from outside, that is, taken as an outer shell of the electronic device 200. Moreover, the heat dissipation module 100 has an imaginary structural plane 500 that a heat-absorbing plate 150 of the heat dissipation module 100 is in thermal contact with the electronic element 310 at the structural plane 500. Furthermore, the casing 400 further comprises a bottom shell 430. The normal line of the structural plane 500 and the normal line of the surface of the bottom shell 430 form a second included angle together. The second included angle is greater than 0 degree. In this embodiment, the normal line of the structural plane 500 is perpendicular to the normal line of the surface of the bottom shell 430.

In some embodiment, the casing 400 further comprises a top shell 420. The top shell 420 and the bottom shell 430 are disposed at two opposite side of the casing 400. Fin elements 111-131 extend from the bottom shell 430 to the top shell 420 along a first direction D1. When the electronic device 200 is operated, the electronic element 310 and some elements (not shown) of the circuit board 300 generate heat. The heat may be transferred to the heat dissipation module 100 to be cooled. Moreover, the heat generated by the electronic element 310 and some elements of the circuit board 300 may be performed heat transfer with the outside air via the heat dissipation module 100. The air which absorbs the heat may flow from bottom to top towards the top shell 420. At the same time, because the fin elements 111-131 extend from the bottom shell 430 to the top shell 420, an air flowing channels are formed between a pair of the adjacent fin elements 111-131, respectively. The air which absorbs the heat may flow upward via the air flowing channels. By a chimney effect, the hot air may flow upward (to the top shell 420) via the air flowing channels, and cool air may flow downward (to the bottom shell 430) via the air flowing channels. Hence, the air may rapidly flow through the air flowing channels circularly to remove the heat from the electronic element 310 and the circuit board 300, thereby improving the heat dissipation efficiency of the heat dissipation module 100.

According to the disclosure, the bottom shell 430 is defined that an outer shell of the casing 400 facing a horizontal plane.

In this embodiment, each of the fin elements 111-131 includes a recess 170, an inner surface 180, an outer surface 182, a first heat dissipation surface 184 and a second heat dissipation surface 186 (take the fin element 111 as an example). The inner surface 180 of the fin element 111 facing the structural plane 500 forms the recess 170 which is formed inwardly towards the fin elements 111-131 within the casing 400. The outer surface 182 of the fin element 111 away from the structural plane 500 forms another recess 170 which is formed inwardly towards the fin elements 111-131 within the casing 400 as well. The first heat dissipation surface 184 and the second heat dissipation surface 186 opposite to each other are formed between the inner surface 180 and the outer surface 182. When the electronic device 200 is operated, the airflow which absorbs the heat may flow to the inner surface 180, an outer surface 182, the first heat dissipation surface 184 and the second heat dissipation surface 186 of the fin elements 111-131 along a the-bottom-shell 430-to-the-top-shell 420 direction. Take the fin element 111 as an example. The airflow may flow along the inner surface 180, the outer surface 182, the first heat dissipation surface 184 and the second heat dissipation surface 186 of the fin element 111. When the airflow flows to the outer surfaces 182 of the fin elements 111-131, a boundary layer is formed due to the friction between the airflow and the outer surfaces 182 of the fin elements 111-131. In detail, when the airflow is closer to the outer surfaces 182, the velocity of the airflow is much reduced. On the contrary, when the airflow is farther away from the outer surfaces 182, the velocity of the airflow is increased. When the airflow flows to the recess 170, the boundary layer of the airflow is destroyed by the recess 170 and the boundary layer is formed again in the recess 170 (when the boundary layer is destroyed, the velocity is increased), thereby increasing the velocity of the airflow. It could be understood that the heat dissipation efficiency of the heat dissipation module 100 is increased by the structure of the recess 170. Similarly, when the airflow passes through the inner surface 180, the first heat dissipation surface 184 and the second heat dissipation surface 186, the airflow generates other boundary layers due to the friction between the air flow and the inner surface 180, the first heat dissipation surface 184 and the second heat dissipation surface 186. After that, the recesses 170 of the fin elements 111-131 may destroy the other boundary layers formed by the inner surface 180, the first heat dissipation surface 184 and the second heat dissipation surface 186. Thus, the heat dissipation efficiency of the heat dissipation module 100 is increased by the recesses 170.

Figure 5:
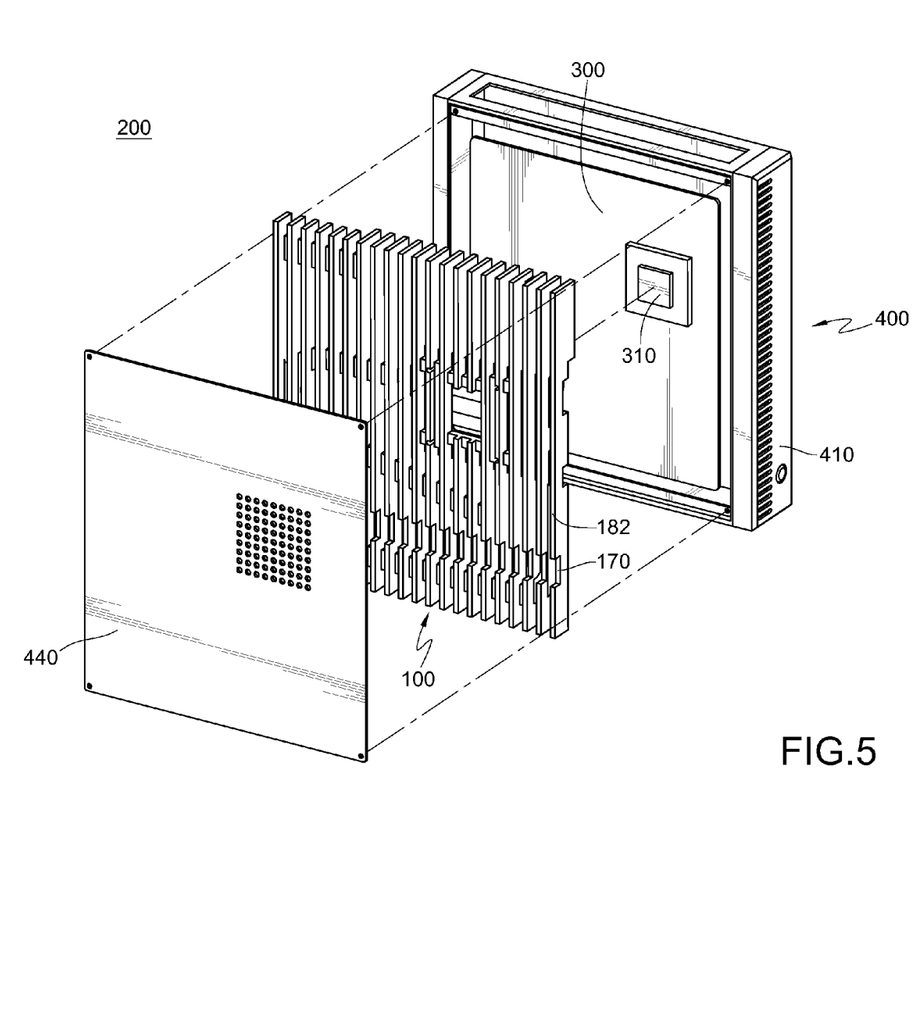
FIG. 5 is an exploded view of an electronic device according to another embodiment.

Please refer to FIG. 5, which is an exploded view of an electronic device according to another embodiment. The structure in this embodiment is similar to that of the embodiment in FIGS. 4A, 4B, and the same numerals represent the similar elements, so the similar descriptions are not repeated herein. In this embodiment, the casing 400 comprises a cover 440 disposed on the same side of the mainframe 410 with the heat dissipation module 100. The heat dissipation module 100 in this embodiment is disposed between the cover 440 and the circuit board 300. Therefore, the cover 440 may prevent the heat dissipation module 100 from direct exposure.

Figure 6:
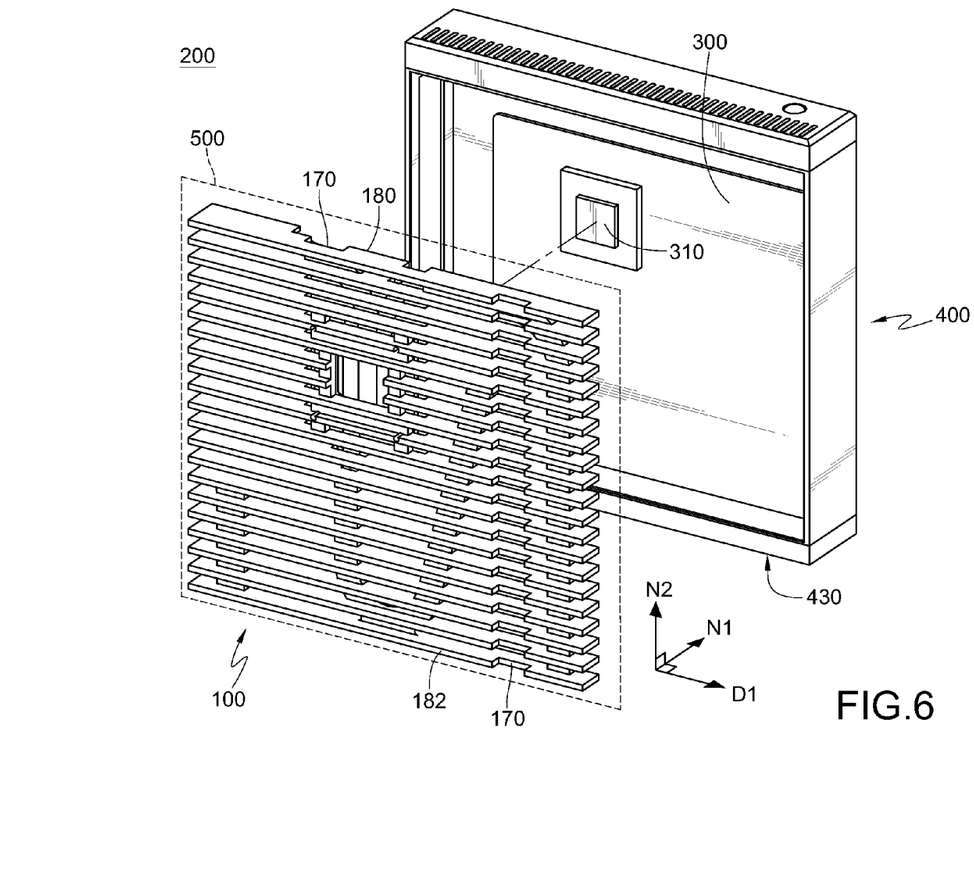
FIG. 6 is an exploded view of an electronic device according to yet another embodiment.

The above-mentioned arrangements of the heat dissipation modules 100 are not limited to the disclosure. Please refer to FIG. 6, which is an exploded view of an electronic device according to yet another embodiment. The structure in this embodiment is similar to that of the embodiment in FIGS. 4A, 4B, and the same numerals represent the similar elements, so the similar descriptions are not repeated herein. In this embodiment, the circuit board 300 stands on the bottom shell 430 of the casing 400, and the normal line N1 of the structural plane 500 is perpendicular to the normal line N2 of the bottom shell 430. Moreover, the normal line N1 of the structural plane 500. Thus, the heat dissipation efficiency of the heat dissipation module 100 may be improved.

Figure 7:
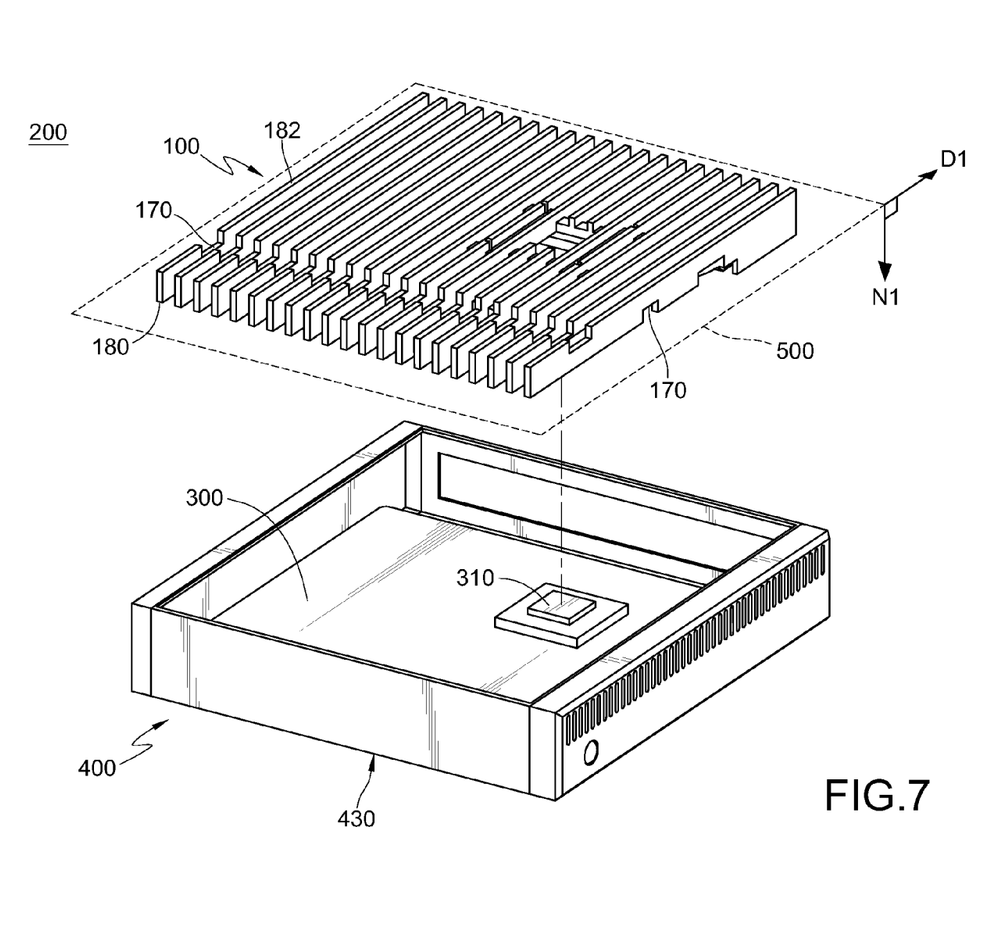
FIG. 7 is an exploded view of an electronic device according to still another embodiment.

The above-mentioned arrangements of the heat dissipation modules 100 are not limited to the disclosure. Please refer to FIG. 7, which is an exploded view of an electronic device according to still another embodiment. The structure in this embodiment is similar to that of the embodiment in FIGS. 4A, 4B, and the same numerals represent the similar elements, so the similar descriptions are not repeated herein. In this embodiment, the mainframe 410 comprises a bottom shell 430 disposed on a lower side of the electronic device 200. The structural plane 500 faces the bottom shell 430. That is, in this embodiment, the largest area of the circuit board 300 faces the bottom shell 430, and the largest area of the heat dissipation module 100 faces the bottom shell 430, too. In other words, the heat dissipation module 100 lies on the casing 400. Thus, the heat dissipation efficiency of the heat dissipation module 100 may be improved.

To sum up, the electronic element is in thermal contact with the heat dissipation module. By the hollow shapes formed between fin elements and the disposing of the heat pipe, the heat, generated by the electronic element, may spread to the heat dissipation module evenly so that the heat dissipation module may be in a uniform-temperature state quickly. Therefore, the heat, generated by the electronic element, is rapidly removed by the heat pipes and the fin elements of the heat dissipation module. Moreover, the fin assembly (the fin elements) and the connecting part are integrated and formed into one piece by die casting so as to improve the structural strength of the heat dissipation module. Compared to the conventional technology, because of the hollow-shaped of the electronic element and the heat dissipation module, the electronic element and the heat dissipation module in the disclosure solve the problem of poor heat dissipation efficiency, which increases the outside contact area and the addition of the heat pipes to improve the heat dissipation efficiency, thereby enhancing the stability of the thin client when operating.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A heat dissipation module, having an imaginary structural plane, comprising:
    a fin assembly disposed on the structural plane and comprising a plurality of fin elements extending along a first direction;
    a connecting part connected to the fin elements, wherein the fin elements are connected to each other via the connecting part; and
    a heat pipe, wherein at least one portion of the connecting part is connected to at least one portion of the heat pipe, and the connecting part and the heat pipe both extend along a second direction;
    wherein the fin assembly and the connecting part are integrated and formed into one piece by die casting, and the first direction and the second direction form a first included angle greater than 0 degree together.

2. The heat dissipation module according to claim 1, wherein the first direction is perpendicular to the normal line of the structural plane.

3. The heat dissipation module according to claim 1, wherein the connecting part includes a container, wherein the heat pipe is disposed in the container.

4. The heat dissipation module according to claim 1, further comprising a heat-absorbing plate connected to at least one of the fin elements and the heat-absorbing plate including a contact surface coplanar with the structural plane.

5. The heat dissipation module according to claim 4, wherein the heat-absorbing plate comprises:
    a main body connected to at least one of the fin elements; and
    a heat-conducting element disposed on the main body.

6. The heat dissipation module according to claim 1, wherein each of the fin elements has an outer surface and a recess, respectively, wherein the outer surfaces are away from the structural plane and form the recesses towards the fin elements inwardly.

7. An electronic device, comprising:
    a circuit board comprising an electronic element; and
    a casing, in which the circuit board is disposed, comprising:
        a mainframe; and
        a heat dissipation module disposed on a side of the mainframe, being in thermal contact with the electronic element, and having an imaginary structural plane, the heat dissipation module comprising:
            a fin assembly disposed on the structural plane and comprising a plurality of fin elements extending along a first direction;
            a connecting part connected to the fin elements, wherein the fin elements are connected to each other via the connecting part; and
            a heat pipe, wherein at least one portion of the connecting part is connected to at least one portion of the heat pipe, and the connecting part and the heat pipe both extend along a second direction;
            wherein the fin assembly and the connecting part are integrated and formed into one piece by die casting, and the first direction and the second direction form a first included angle greater than 0 degree together.

8. The electronic device according to claim 7, wherein the first direction is perpendicular to the normal line of the structural plane.

9. The electronic device according to claim 7, wherein the heat dissipation module further comprises a heat-absorbing plate connected to at least one of the fin elements and the heat-absorbing plate including a contact surface coplanar with the structural plane.

10. The electronic device according to claim 9, wherein the heat-absorbing plate comprises:
    a main body connected to at least one of the fin elements; and
    a heat-conducting element disposed on the main body and for being in thermal contact with the electronic element.

11. The electronic device according to claim 7, wherein each of the fin elements has an outer surface and a recess, respectively, wherein the outer surfaces are away from the structural plane and form the recesses towards the fin elements inwardly within the casing.

12. The electronic device according to claim 7, wherein the casing further comprises a cover disposed on the side of the mainframe, wherein the heat dissipation module is disposed between the cover and the circuit board.

13. The electronic device according to claim 7, wherein the casing further comprises a bottom shell, wherein the circuit stands on the bottom shell, and the structural plane and the bottom shell form a second included angle greater than 0 degree.

14. The electronic device according to claim 13, wherein the casing further comprises a top shell, wherein the top shell and the bottom shell are disposed at two opposite side of the casing, and the first direction extends from the bottom shell to the top shell.

15. The electronic device according to claim 7, wherein the mainframe comprises a bottom shell facing the structural plane.

16. A heat dissipation module, for being in thermal contact with an electronic element and having an imaginary structural plane, comprising:
    a connecting part including a container;
    a plurality of fin elements extending outwardly from the structural plane, wherein each of the fin elements has an outer surface away from the structural plane, respectively;
    a heat-absorbing plate connected to at least one of the fin elements and including a contact surface coplanar with the structural plane, wherein the heat-absorbing plate is used for being in thermal contact with the electronic element at the contact surface; and
    a heat pipe disposed in the container and for being in thermal contact with the heat-absorbing plate and the connecting part.

17. The heat dissipation module according to claim 16, wherein the fin elements extends outwardly along a first direction from the connecting part.

18. The heat dissipation module according to claim 17, wherein the first direction is perpendicular to a long axis of the connecting part.

19. The heat dissipation module according to claim 16, wherein the heat-absorbing plate comprises:
    a main body connecting to at least one of the fin elements; and
    a heat-conducting element disposed on the main body and for being in thermal contact with the electronic element.

20. The heat dissipation module according to claim 16, wherein each of the fin elements has a recess, respectively, wherein the recesses are formed towards the fin elements inwardly.

* * * * *